United States Patent [19]

Matsuoka

[11] Patent Number: 5,389,820
[45] Date of Patent: Feb. 14, 1995

[54] IC CARRIER

[75] Inventor: Noriyuki Matsuoka, Yokohama, Japan

[73] Assignee: Yamaichi Electronics Co., Ltd., Tokyo, Japan

[21] Appl. No.: 170,904

[22] Filed: Dec. 21, 1993

[30] Foreign Application Priority Data

Dec. 22, 1992 [JP] Japan .................. 4-356950

[51] Int. Cl.⁶ .............. H01L 39/02; H01L 23/48; H01L 29/44; H01L 29/52
[52] U.S. Cl. .................... 257/727; 257/678; 257/724; 257/702; 439/70; 439/68
[58] Field of Search .......... 257/700, 701, 702, 725, 257/726, 727, 678; 439/68, 70, 159, 359, 526; 174/52.4

[56] References Cited

U.S. PATENT DOCUMENTS

| | | | |
|---|---|---|---|
| 3,409,861 | 11/1968 | Barnes et al. | 257/727 |
| 4,598,308 | 7/1986 | James et al. | 257/702 |
| 4,692,790 | 9/1987 | Oyamada | 257/727 |
| 5,070,389 | 12/1991 | Noriyuki | 439/68 |
| 5,076,794 | 12/1991 | Ganthier | 439/70 |
| 5,296,741 | 3/1994 | Kim | 257/724 |

Primary Examiner—Andrew J. James
Assistant Examiner—S. V. Clark
Attorney, Agent, or Firm—Wenderoth, Lind & Ponack

[57] ABSTRACT

An IC carrier comprising a carrier body carrying an IC body, which is either alone or received in a protective case, a wiring sheet with a lead pattern applied onto an upper surface thereof and on which the wiring sheet is superimposed in such a manner as to cover an outer upper surface of the IC body, a plurality of fine adjustment pushers for pressing the IC body or the protective case sidewardly at plurality of points in order to slightly move the IC body or the protective case along an inner upper surface of the wiring sheet to adjust the position of the IC body so as to correctly correspond to the wiring sheet, each of the fine adjustment pushers being formed of male screw pins which are threadedly engaged with the carrier body and reciprocally moved, the IC body or the protective case being pressed sidewardly by end faces of the male screws, respectively.

5 Claims, 12 Drawing Sheets

F I G. 15
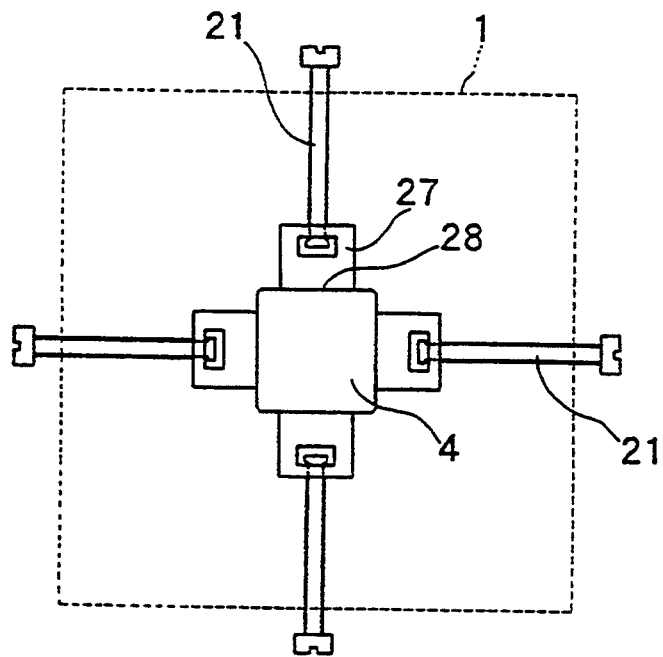
F I G. 16
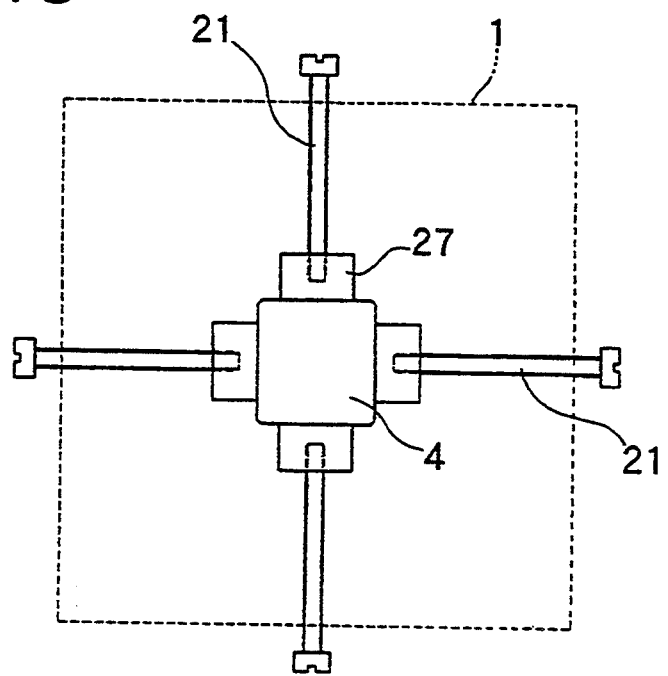

IC CARRIER

BACKGROUND OF THE INVENTION

1. Field of the Invention

This invention relates to an IC carrier on which an IC is removably carried so as to be subjected to delivery, storage, or electrical connection with an IC socket.

2. Brief Description of the Prior Art

In the case where an IC has a plurality of IC contact elements arranged at very small pitches, contacts on a socket are difficult to be connected directly to those IC contact elements. The reasons are that there is technical limitation in miniaturizing the physical size of the contacts and in reducing the pitches for implanting the contacts in the socket. However, since the IC is needed to be subjected to various kinds of aging tests, there is demanded a provision of a suitable means for enabling the IC to be to electrically connected to the socket and a testing device.

SUMMARY OF THE INVENTION

It is therefore an object of the present invention to provide an IC carrier, in which an IC body having IC contact elements arranged at very small pitches is fully protected through a wiring sheet and correctly connected to contacts on a socket, and the position of the IC body can be adequately slightly adjusted relative to the wiring sheet.

To achieve the above objects, there is essentially provided an IC carrier comprising a carrier body carrying an IC body, which is either alone or received in a protective case, a wiring sheet with a lead pattern applied onto an upper surface thereof and on which the wiring sheet is superimposed in such a manner as to cover an outer upper surface of the IC body, a plurality of fine adjustment pushers for pressing the IC body or the protective case sidewardly at plurality of points in order to slightly move the IC body or the protective case along an inner upper surface of the wiring sheet to adjust the position of the IC body so as to correctly correspond to the wiring sheet, each of the fine adjustment pushers being formed of male screw pins which are threadedly engaged with the carrier body and reciprocally moved, the IC body or the protective case being pressed sidewardly by end faces of the male screws, respectively.

From another aspect of the invention, there is provided an IC carrier comprising a carrier body carrying an IC body, which is either alone or received in a protective case, a wiring sheet with a lead pattern applied onto an upper surface thereof and on which the wiring sheet is superimposed in such a manner as to cover an outer upper surface of the IC body, a plurality of fine adjustment pushers for pressing the IC body or the protective case sidewardly at plurality of points in order to slightly move the IC body or the protective case along an inner upper surface of the wiring sheet to adjust the position of the IC body so as to correctly correspond to the wiring sheet, each of the fine adjustment pushers being formed of a plain pin which is slidingly fitted into the carrier body and reciprocally moved, the carrier body being provided with fixture means for fixing the plain pin, the IC body or the protective case being pressed sidewardly by an end face of the plain pin.

From a further aspect of the invention, there is provided an IC carrier comprising a carrier body carrying an IC body, which is either alone or received in a protective case, a wiring sheet-with a lead pattern applied onto an upper surface thereof and on which the wiring sheet is superimposed in such a manner as to cover an outer upper surface of the IC body, a plurality of fine adjustment pushers for pressing the IC body or the protective case sidewardly at plurality of points in order to slightly move the IC body or the protective case along an inner upper surface of the wiring sheet to adjust the position of the IC body so as to correctly correspond to the wiring sheet, each of the fine adjustment pushers being formed of an eccentric cam member.

BRIEF DESCRIPTION OF THE DRAWINGS

FIG. 15 is a plan view showing another example of a pressing pad;

FIG. 16 is a plan view showing a further example of a pressing pad;

DETAILED DESCRIPTION OF THE EMBODIMENTS

Figure 1:
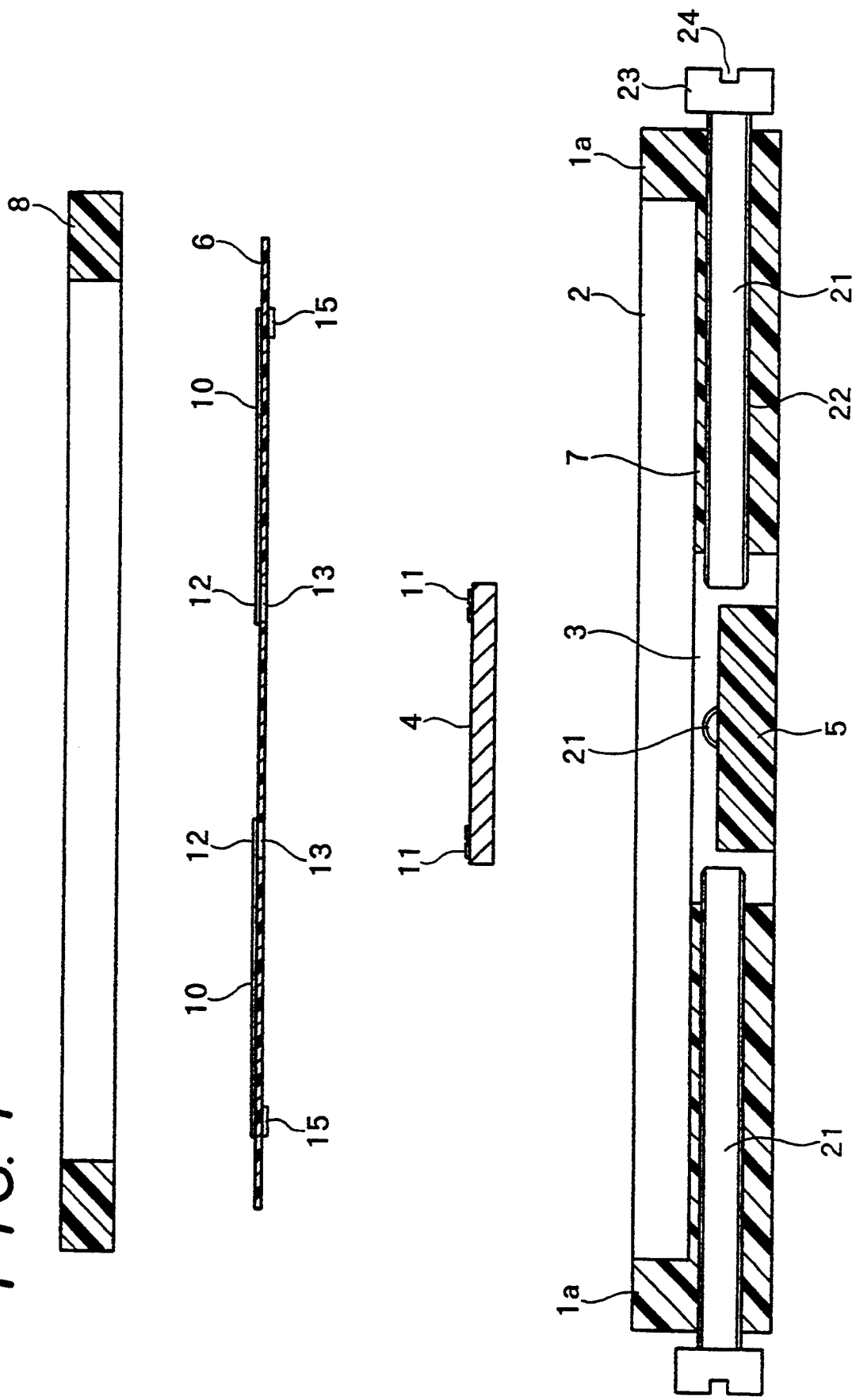
FIG. 1 is an exploded cross-sectional view of an IC carrier according to one embodiment of the present invention.
Figure 2:
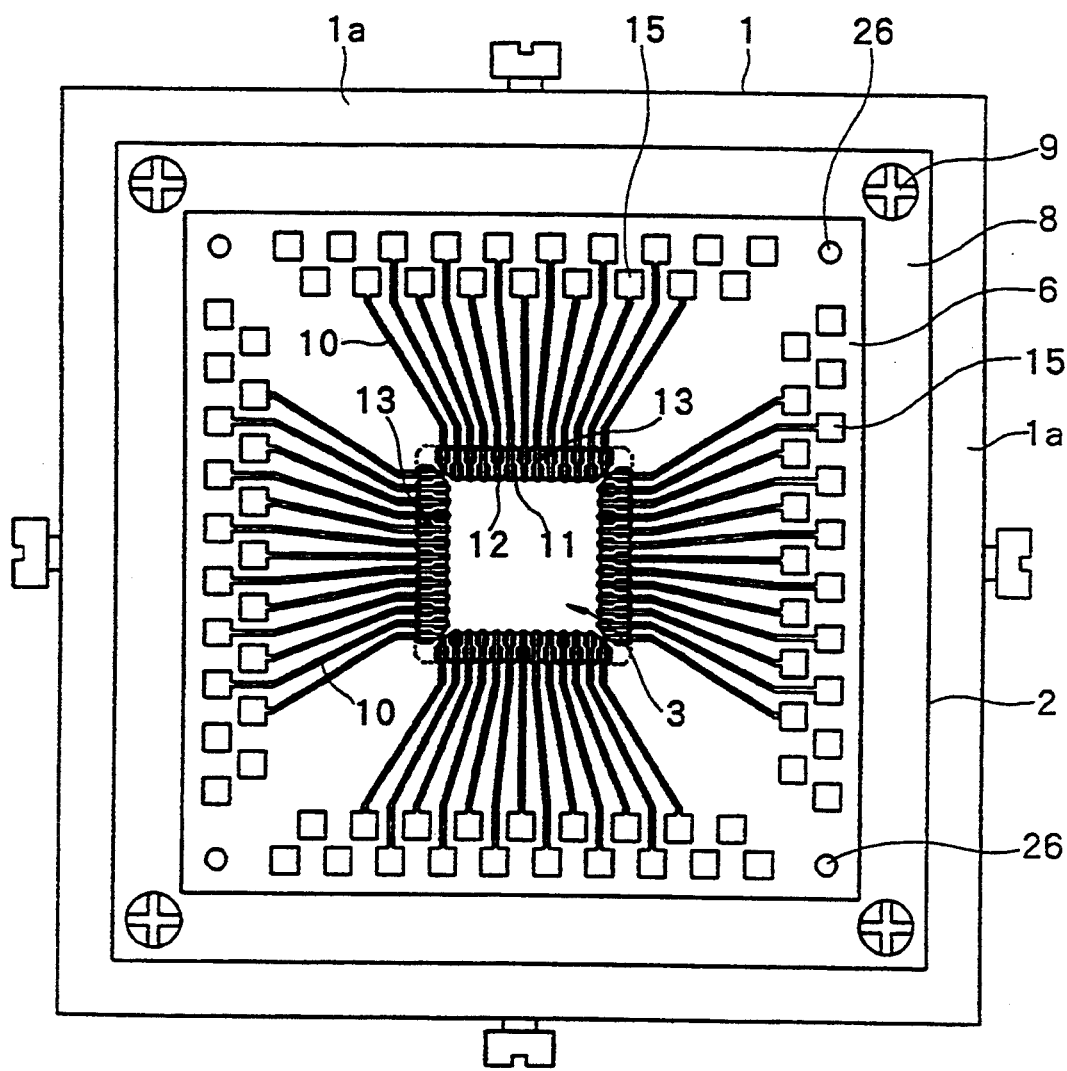
FIG. 2 is a plan view of the IC carrier, now in assembled, of FIG. 1.
Figure 3:
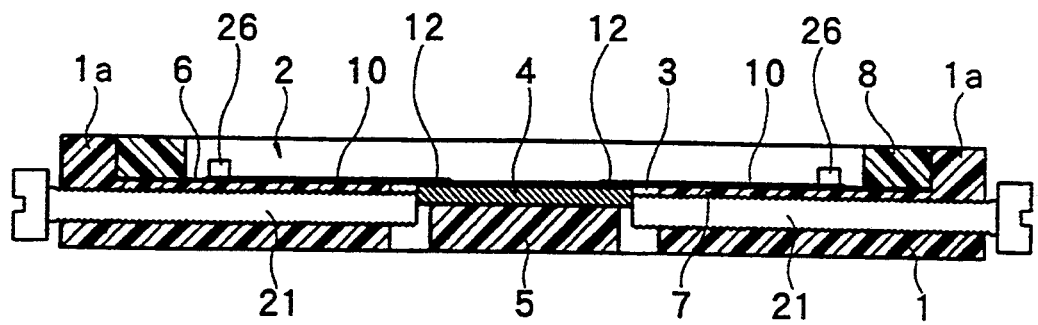
FIG. 3 is a cross-sectional view of the IC carrier of FIG. 2, showing male screw pins used as fine adjustment pushers.
Figure 4:
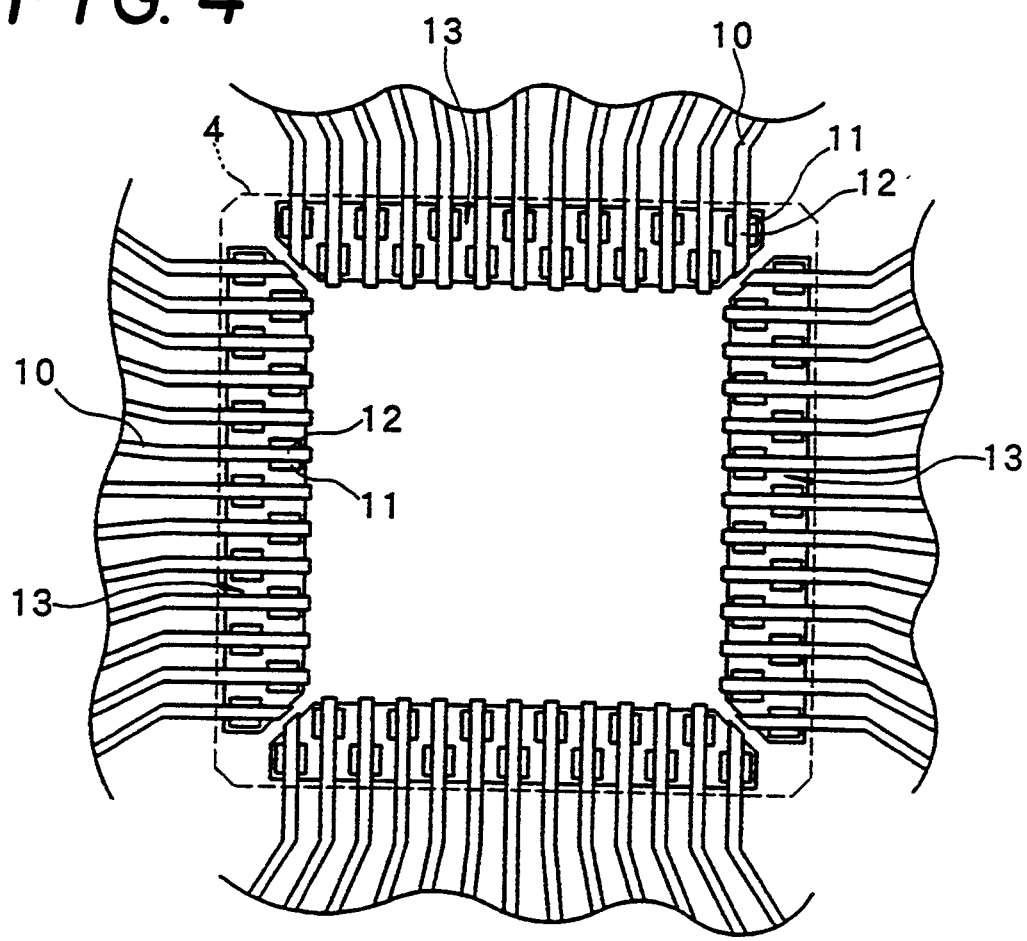
FIG. 4 is an enlarged plan view showing a contacting portion between an IC body and a wiring sheet in the above IC carrier.
Figure 5:
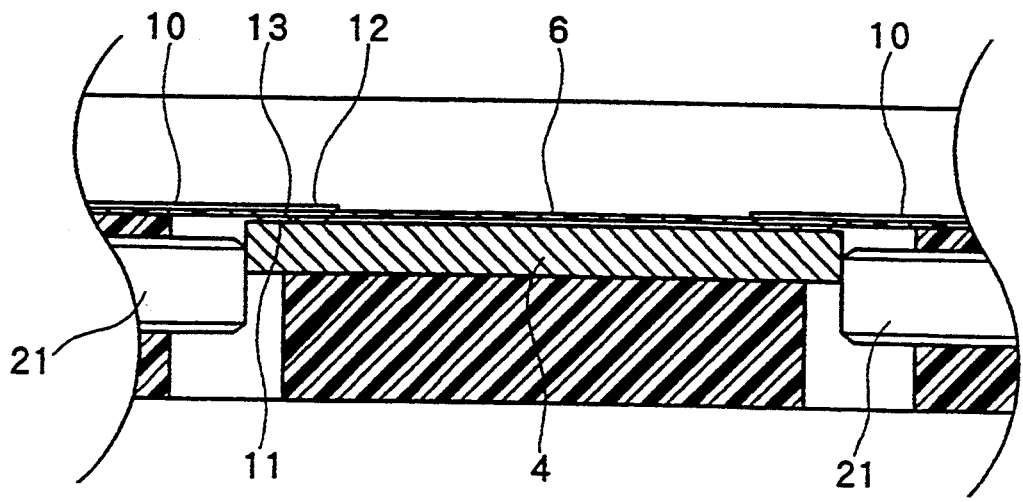
FIG. 5 is an enlarged cross-sectional view of FIG. 4.
Figure 6:
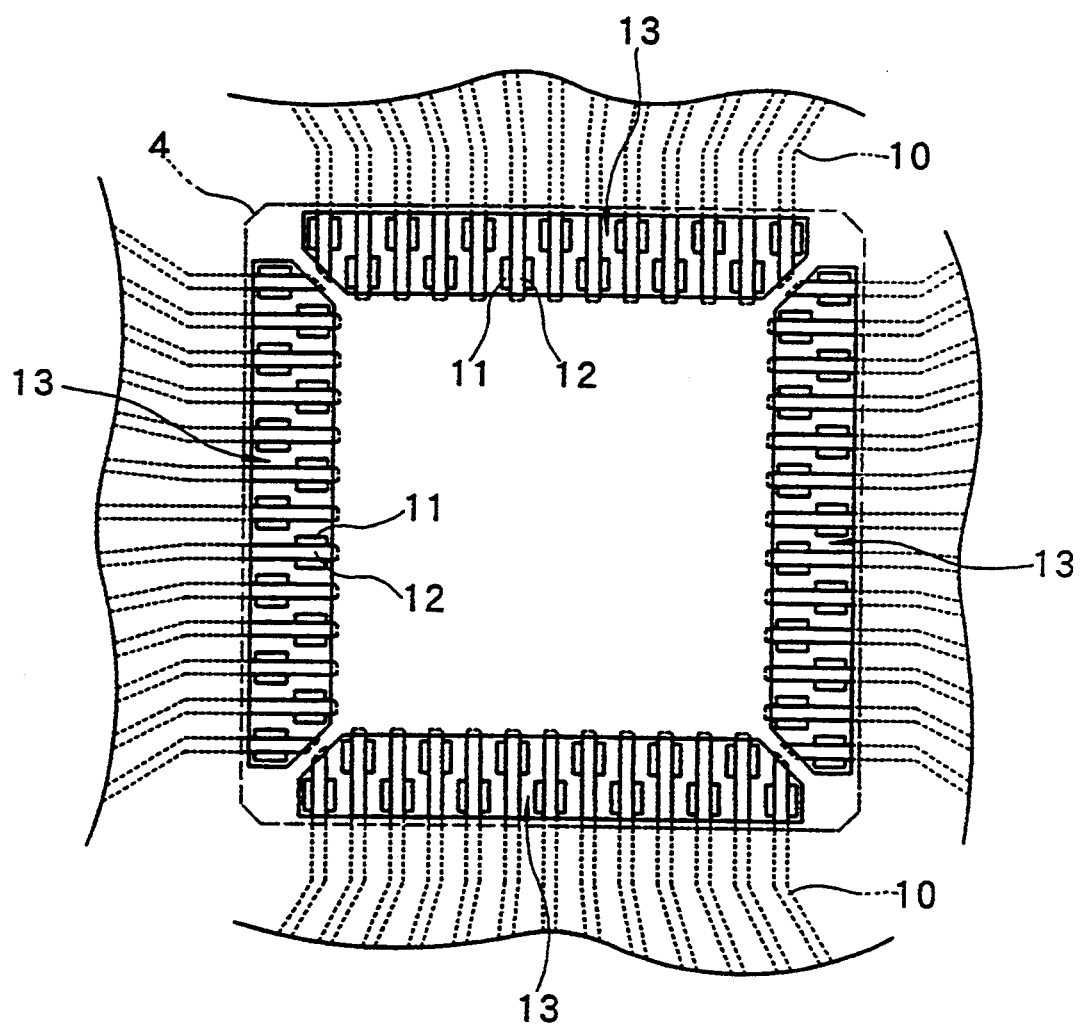
FIG. 6 is an enlarged plan view showing a modification a contacting portion between the wiring sheet and the IC body.
Figure 7:
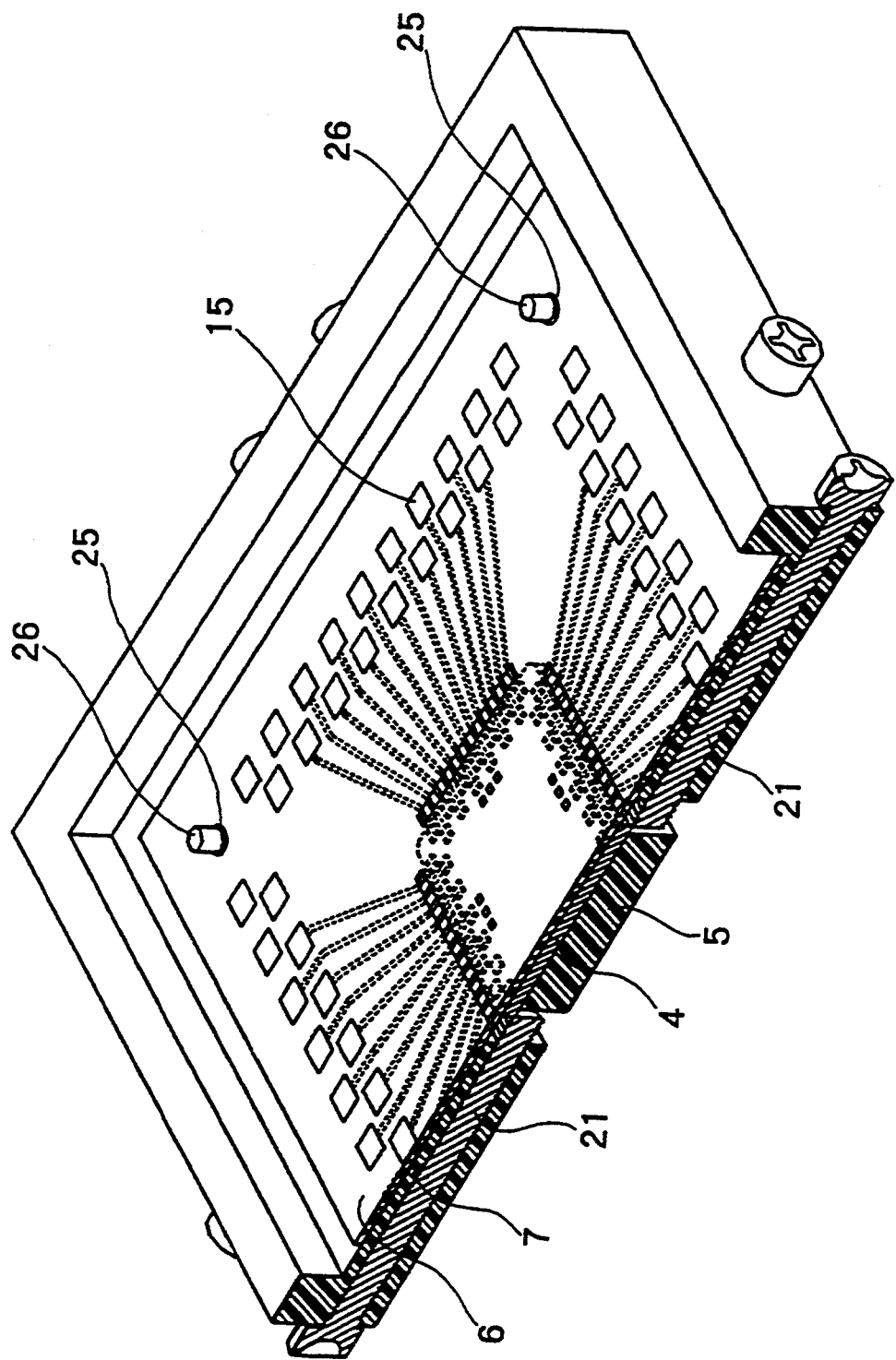
FIG. 7 is a half-cut perspective view of the IC carrier.

Several embodiments of the present invention will be described in great detail with reference to FIGS. 1 through 20. As shown in FIGS. 1 through 3, as well as elsewhere, a carrier 1, which is made of an insulating material, is of a planar, generally square configuration. The carrier 1 includes a generally square sheet receiving portion 2 whose upper surface is opened. An IC receiving portion 3 is formed in a central portion of the sheet receiving portion 2 and is opened at an inner bottom surface of the sheet receiving portion 2. An IC body 4 is received in the IC receiving portion 3 and supported on a support seat 5 which is formed on an inner bottom surface of the IC receiving portion 3, while a wiring sheet 6 is received in the sheet receiving portion 2 and supported on a support seat 7 which is formed on a bottom surface of the sheet receiving portion 2.

The IC body 4, which is supported on the support seat 5, is in contact with or in opposite adjacent relation to a central portion of and covered with the wiring sheet 6 which is supported on the support seat 7. To satisfy the foregoing arrangement, an upper surface of the IC body 4, which is received in the IC receiving portion 3, is generally flush with the support seat 7.

Thus, the IC body 4 is in a superimposed relation to the wiring sheet 6 and assembled, as one piece, together with the carrier 1. FIGS. 1 and 2, for example, show one example of a means for assembling these component parts into one piece, in which a frame member 8 generally equal in dimension to the sheet receiving portion 2 is formed, and this frame member 8 is fitted to an inner peripheral edge of the sheet receiving portion 2 with corner portions of the frame member 8 tightly secured to the carrier 1 by screws 9 or the like. By securing the wiring sheet 6 onto the support seat 7 of the carrier 1, the IC body 4 is held between the carrier 1 and the support seat 5.

Figure 20:
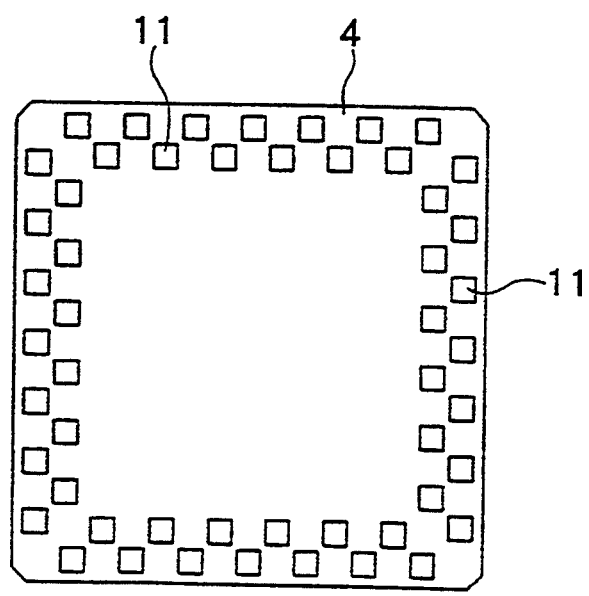
FIG. 20 is a plan view of the IC body.

As best shown in FIG. 20, the IC body 4 is of a generally square outer configuration and has a number of contact elements 11 arranged in array on its upper surface. First contact pads 12, as will be described hereinafter, on the wiring sheet 6 is placed or superimposed on these contact elements 11, thereby creating an electrical connection between leads 10 and the contact elements 11.

The wiring sheet 6 is made of a flexible insulating material such as synthetic resin film, and has thereon a lead pattern corresponding to the contact elements 11 on the IC body 4. The wiring sheet 6 is made of a wiring substrate having a comparatively rigid property. The respective leads 10, which form the lead pattern, are intimately attached onto the wiring sheet 6 by, for example, printing, and radially extend from a central portion (superimposed portion relative to the IC body 4) of the wiring sheet 6 toward a peripheral portion thereof. Inner ends of the leads 10 extending to the superimposed portion are provided with the first contact pads 12 arranged at small pitches so as to be placed opposite to the contact elements 11 which are arranged likewise at small pitches on the upper surface of the IC body 4. Outer ends of the leads 10 extending to the peripheral portion of the wiring sheet 6 are provided with second contact pads 15 arranged at comparatively large pitches so as to be placed opposite to contacts which are arranged likewise at comparatively large pitches on a socket body. That is, in the lead pattern, the second contact pads 15 formed on the outer end of the lead pattern are widely spread toward the outer area of the IC body 4 so as to be subjected to connection with the contacts. For example, the second contact pads 15 are arranged side by side along an inner peripheral surface of the frame member 8.

As shown in FIGS. 1 through 3, the lead pattern is formed on the upper surface side of the wiring sheet 6, and the first contact pads 12 are placed opposite to the contact pieces 11 on the IC body 4 through an opening as will be described, so as to be subjected to connection with the socket.

FIGS. 4 through 7 show another example, in which the lead pattern is formed on the inner upper surface side which is held in superimposed relation with the IC body 4, and the first contact pads 12 are disposed likewise on the inner upper surface side which is held in superimposed relation with the IC body 4. On the other hand, the second contact pads 15 are arranged such that they are exposed outside at the upper surface of the wiring sheet 6 placed opposite to the contacts.

The IC body 4 is received in the IC receiving portion 3 such that the former is permitted to slightly move therein in a horizontal direction. In other words, the IC body 4 is received in the IC receiving portion 3 such that the former can slidingly move on the upper surface of the support seat 5 in the horizontal direction.

Figure 8:
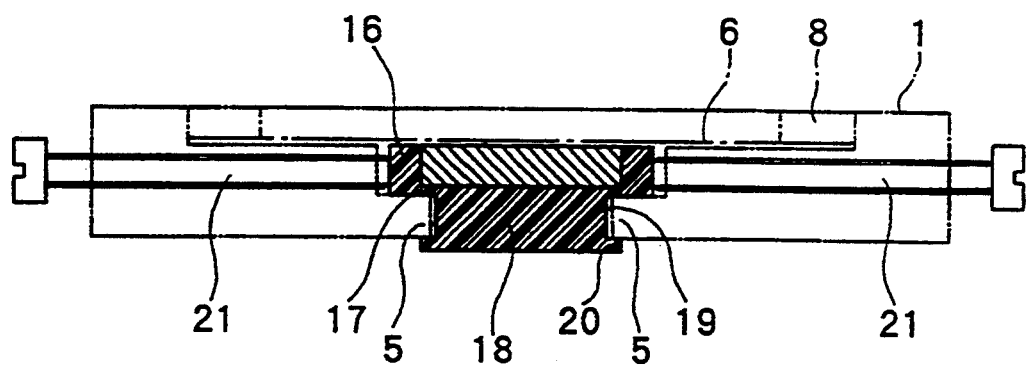
FIG. 8 is a cross-sectional view showing a protective case for the IC body and fine adjustment pushers.
Figure 10:
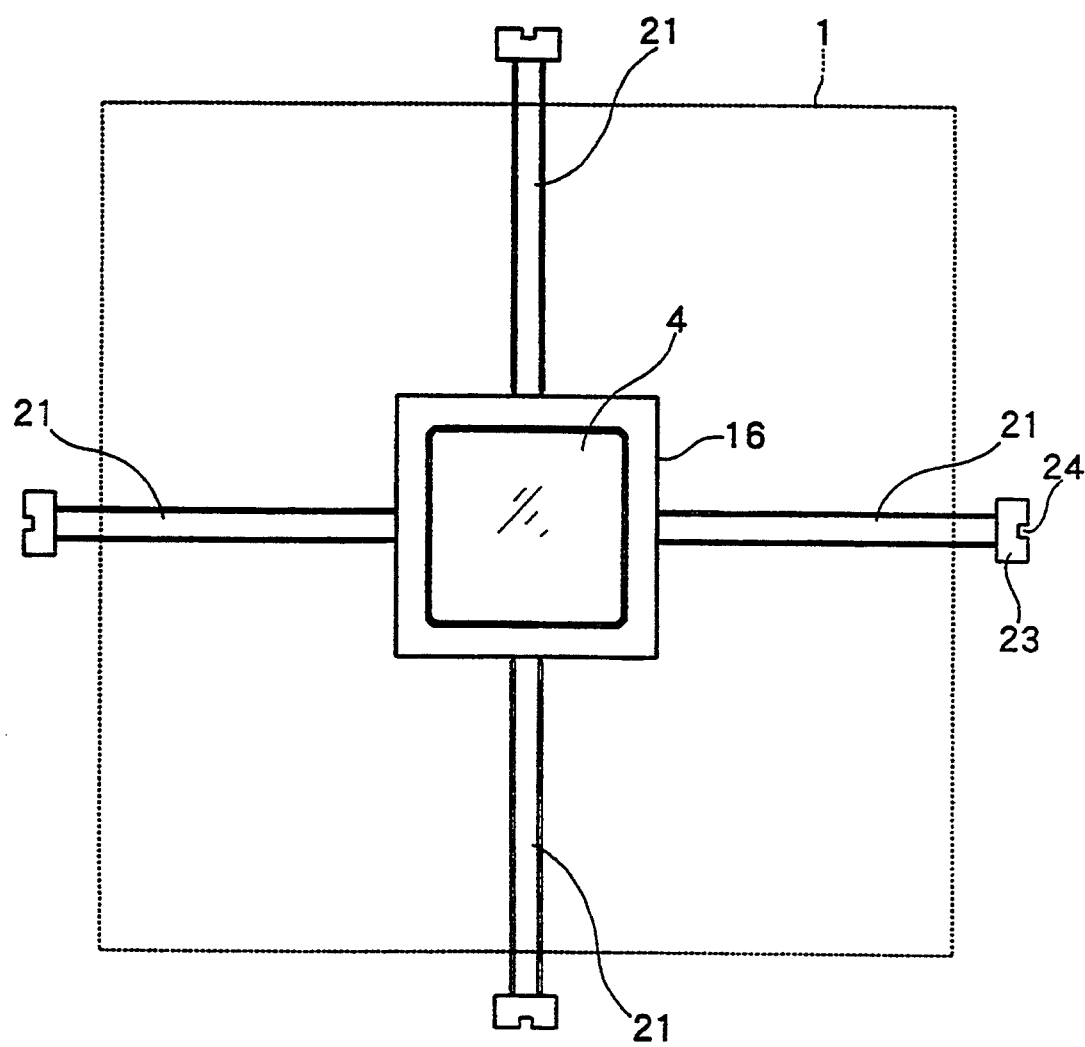
FIG. 10 is a plan view showing one example of an arrangement of the fine adjustment pushers relative to the IC body.

As shown in FIGS. 8 and 10, a modification is made possible in which the IC body 4 is received in a protective case 16 with the contact elements 11 on the IC body 11 permitted to be exposed outside from an open upper surface of the protective case 16.

The IC body 4 is tightly received in the protective case 16 such that there is almost no room left for playing. The case 16 is, in turn, received in the IC receiving portion 3 such that the former is permitted to slightly move therein in a horizontal direction. In other words, the protective case 16 is received in the IC receiving portion 3 such that the former can slide on the upper surface of the support seat 5 and the inner upper surface of the wiring sheet in the horizontal direction while holding the IC body 4. In other words, the IC body 4 is held between the carrier body 1 and the wiring sheet 6 and movable in the horizontal direction.

Figure 9:
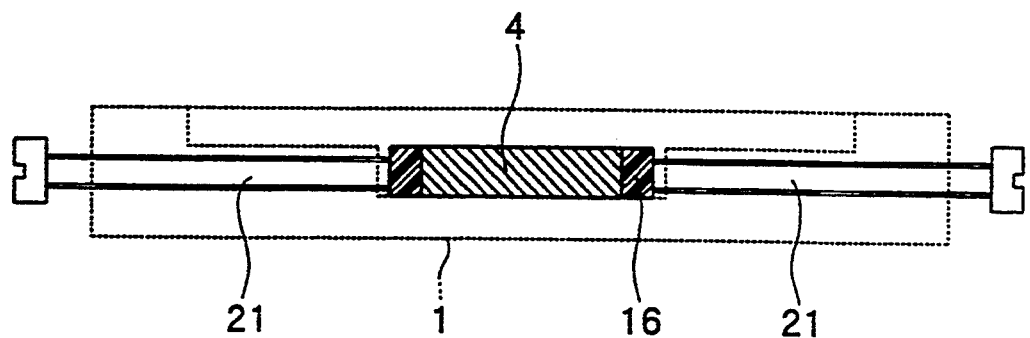
FIG. 9 is a cross-sectional view showing a modification of a protective case for the IC body, and the fine adjustment pushers.

As shown in FIG. 8, the protective case 16 includes a bottom wall 17 which supports the IC body 4. This bottom wall 17 is supported on the support seat 5. The bottom wall 17 is provided with a fitting portion 18. This fitting portion 18 is loosely fitted into an opening 19 formed in the support seat 5 and a retaining portion 20 formed at an end portion of the support seat 5 is brought into engagement with an edge portion of a lower surface of the opening 19 so that the protective case 16 does not escape from the carrier body 1. At the same time, the protective case 16 is permitted to move in the horizontal direction within a range of the play which the fitting portion 18 has in the opening 19. As shown in FIG. 9, the protective case 16 is formed of a generally square frame member which has an opening formed all the way through an upper surface to a lower surface thereof. The IC body 4 is fitted in the protective case 16 and firmly secured to an inner peripheral surface of the case by bond or the like. An outer peripheral surface of this protective case 16 is pressed by fine adjustment pins 21 which will be described later.

As described above, it is designed such that the IC carrier body 4 is movably received directly into the IC receiving portion 3 of the carrier body 1, or the IC body 4 is received in the protective case 16 and then received in the IC movably receiving portion 3 of the carrier body 1 through the protective case 16. The carrier body 1 is provided with fine adjustment pushers for adjusting the corresponding position relative to the wiring sheet 6 by pressing the sides of the IC body 4 or the sides of the protective case 16, in which the IC body 4 is already received, within the IC receiving portion 3.

As one concrete example of the fine adjustment pushers, as shown in FIGS. 1 through 3, and 7, as well as elsewhere, there are provided fine adjustment pins as represented by the male screw pins 21. The male screw pins 21 are pierced through the carrier body 1 from outer side surfaces of the carrier body 1 toward the inner surfaces of the IC receiving portion 3. The male screw pins 21 are reciprocally moved by being threadedly engaged with an inner wall of the through-holes 22, respectively. More specifically, a tip of each of the male screw pins 21 can be entered into the IC receiving portion 3. The sides of the IC body 4 are placed opposite to the sides of the protective case 16. A head portion 23 of the male screw pin 21 projects from the outer side surface of the carrier body 1. The male screw pin 21 is reciprocally moved by inserting a driver into a minus groove or plus groove formed in the head portion. As the male screw pin 21 is moved forwardly, it presses the side surface of the IC body 4 or the side surface of the protective case 16 to slightly move either of them in the horizontal direction.

The fine adjustment pins as represented by the above-mentioned male screw pins 21 are arranged such that they are capable of pressing a plurality of side surfaces or corner portions of the IC body 4 or the protective case 16. As shown for example in FIG. 10, a number, four, of the male screw pins 21 are radially arranged so as to be capable of pressing the four side surfaces of the IC body 4 or the protective case 16. By individually reciprocally moving the four male screw pins 21, the IC body 4 or the protecting case 16 can be horizontally moved in all directions in a plane along the inner upper surface of the wiring sheet 6. By doing this, the installing position of the IC body 4 is slightly adjusted relative to the wiring sheet 6, so that the IC contact elements 11 and the first contact pads 12 can be placed correctly opposite to each other.

The wiring sheet 6 is provided with openings 13 through which the correctly opposing condition between the IC contact elements 11 and the first contact pads 12 can be visually confirmed. FIGS. 2 through 4, 6 and 7, as well as elsewhere, show a concrete example of the openings 13. As shown in these Figures, the inner ends of the leads 10 group (first contact pads) are concentrated to the central portion of the wiring sheet 6 and arranged along the respective sides of the IC body 4 which is placed on the central portion, such that they are placed opposite to the IC contact elements 11 group arranged along the respective sides of the IC body 4. The openings 13 are formed along the parts where the first contact pads 12 and the IC contact elements 11 are disposed opposite to each other. That is, the openings 13 are provided at the four sides or at least opposing two sides of the IC body 4, such that the entire or a most part of the first contact pads 12 and the IC contact elements 11, which are placed opposite to each other at the respective sides, can be visually recognized.

The opposing condition between the first contact pads 12 and the IC contact elements 11 can be clearly visually confirmed through the openings 13. By operating the fine adjustment pushers, i.e., male screw pins 21, for example, while visually confirming the opposing condition, the IC body 4 is slightly moved along the inner upper surface of the sheet 6. By doing this, the first contact pads 12 and the IC contact elements 11 can be placed correctly opposite to each other. The IC body 4 is clamped at the side surfaces thereof by the plurality of male screw pins 21 so that the former cannot move, and fixed to the correctly opposing position.

On the other hand,.the wiring sheet 6 is positioned by the inner surfaces or inner corner portions of a peripheral wall 1a which are arranged in a generally square configuration so as to define the sheet receiving portion 2 of the carrier body 1.

Figure 19:
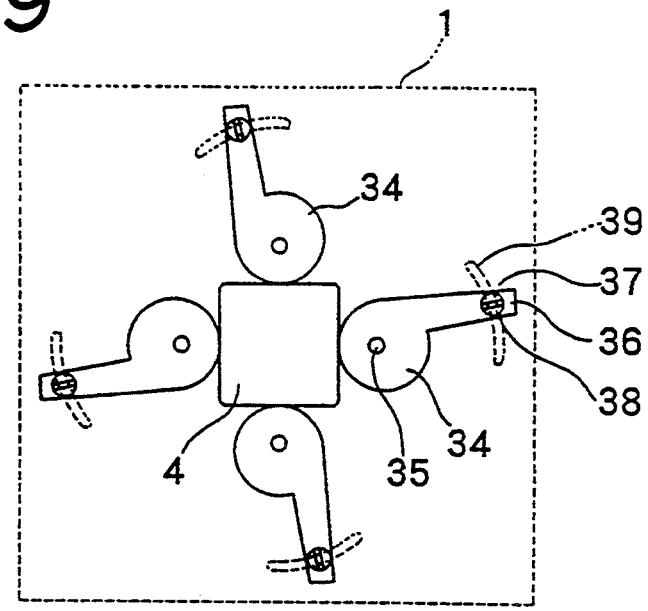
FIG. 19 is a plan view showing a further example in which eccentric cams are used as fine adjustment pushers.

The wiring sheet 6 is positioned by the peripheral wall 1a. Besides, as shown in FIGS. 2 and 19, as well as elsewhere, the peripheral edge portions, for example, the corner portions, of the wiring sheet 6 are provided with positioning apertures 25, and as shown in FIG. 19, as well as elsewhere, the corner portions of the support seat 7 for the wiring sheet 6 are provided with positioning posts 26 extending upwardly. The positioning posts 26 are inserted into the positioning apertures 25 so as to support the wiring sheet 6 on a predetermined position of the support seat 7. At this time, the diameter of each of the positioning posts 26 is formed smaller than the diameter of the corresponding positioning aperture 25. Owing to this difference in diameter, the wiring sheet 6 can be horizontally moved in all directions. After the wiring-sheet 6 is placed correctly opposite to the IC body 4 by the above-mentioned horizontal movement, the frame member 8 is tightly secured to the carrier body 1 by the screws 9 so that the wiring sheet 6 can be assuredly held between the frame member 8 and the carrier body 1.

The screws 9 for tightly securing the frame member 8 are also served as the positioning pins. That is, mounting apertures also serving as the positioning apertures are formed in the corner portions of the wiring sheet 6. The screws 9 are inserted into the mounting apertures, such that the tips of the screws are threadedly engaged with threaded holes formed in the corner portions of the support seat 7 of the carrier body 1. By correctly threading the screws 9 into corresponding mounting apertures respectively, the wiring sheet 6 can be located in right position of the support seat 7, that is, correct position relative to the IC body 4.

By assembling the carrier body 1, the IC body 4 and the wiring sheet 6 together as mentioned above, the IC body 4 is hidden and favorably protected between the carrier body 1 and the wiring sheet 6 so as to be subjected to delivery and storage. By loading the assembly directly on the socket, the second contact pads 15, which are exposed outside from the upper surface of the wiring sheet 6, are pressed against the contacts on the socket for electrical connection so as to be subjected to aging test. The socket is provided with a resilient pressing member adapted to press the superimposed portion of the wiring sheet 6 so as to press the first contact pads 12 against the IC contact elements 11.

Next, several examples of the fine adjustment pushers will be described. The fact that the male screw pins 21 are used as the fine adjustment pushers has been already described. One example for using the male screw pins 21 as the fine adjustment pushers is shown in FIG. 10, in which four male screw pins 21 are arranged on the horizontal and vertical center lines of the IC body 4. In other words, the four male screw pins 21 are arranged such that they form a quarter right angle relative to each other on the horizontal and vertical center lines and extend from the four side surfaces of the carrier body 1 to the four side surfaces of the IC body 4 or the case 16. The tips of the respective pins 21 are disposed opposite to the generally central portions of the respective side surfaces of the IC body 1 or the case 16.

The IC body 4 or the case 1 is fixedly clamped by the four male screw pins 21 being abutted against the respective side surfaces. By appropriately reciprocally moving the respective pins 21, the IC body 4 or the case 16 are caused to slightly move in the horizontal direction so as to be correctly positioned relative to the wiring sheet 6.

Figure 11:
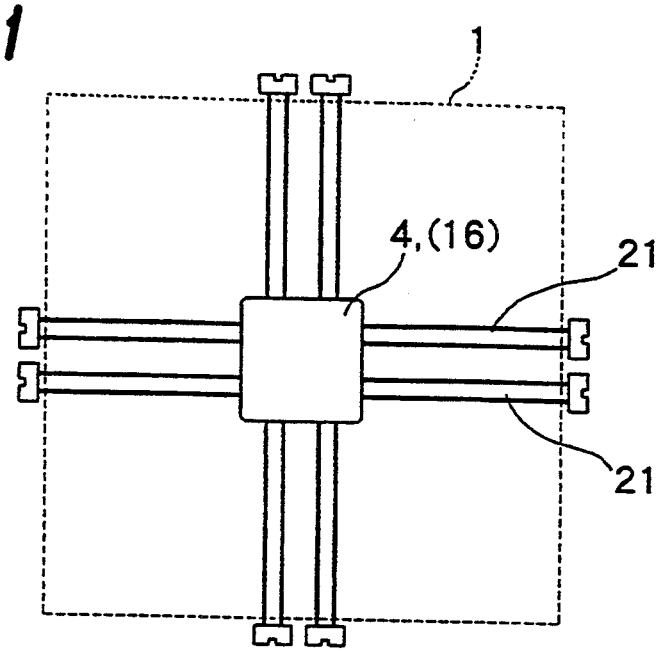
FIG. 11 is a plan view showing another example of an arrangement of the fine adjustment pushers.

As shown in FIG. 11, the arrangement of the male screw pins 21 may be such that two male screw pins 21 extending in parallel relation to each other act on one side surface of the IC body or its case 16. That is, two male screw pins 21 extending in parallel relation to each other are served as one unit, and such four units of male screw pins 21 are disposed at four sides of the IC body 4 or its case 16, so that two male screw pins 21 press each side surface of the IC body 4 or its case 16 to correctly position the body 4 or its case 16. The respective two male screw pins 21 are in parallel relation to the horizontal or vertical center line of the IC body 4 or the IC receiving portion 3 and equidistant from the horizontal or vertical center line. Owing to this arrangement, each side surface of the IC body 4 or the case 16 can be uniformly pressed.

Figure 12:
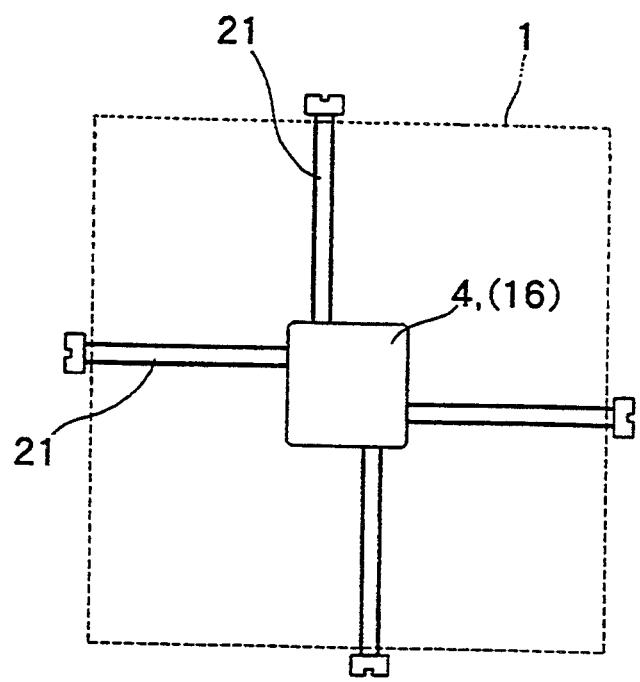
FIG. 12 is a plan view showing a further example of an arrangement of the fine adjustment pushers.
Figure 13:
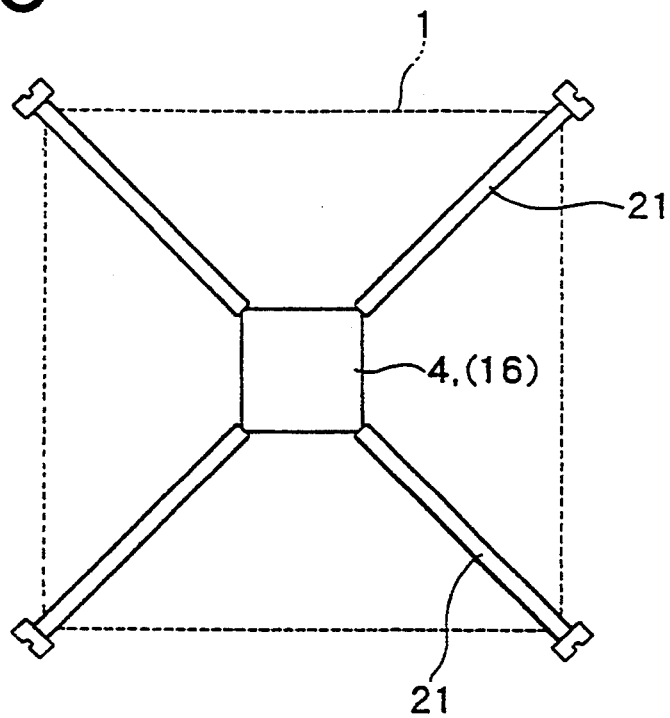
FIG. 13 is a plan view showing a still further example of an arrangement of the fine adjustment pushers.

As shown in FIG. 12, the arrangement of the male screw pins 21 may be such that two male screw pins 21 press the side surfaces of a pair of opposite corner portions of the IC body 4 or the case 16. As in the above description, each of the male screw pins 21 extend perpendicular to each of the side surfaces of the IC body 4 such that the tip is placed opposite to the corresponding side surface of the corner portion of the IC body 4 or the case 16 and the head portion 23 is exposed outside the corresponding side surface of the carrier body 1.

When the male screw pin 21 is turned by a driver or the like inserted into the minus or plus groove formed in the head portion 23, the pin 21 is moved forwardly and backwardly depending on the turning direction and press the corresponding corner portion of the IC body 4 or the case 16 to slightly move the IC body 4 or the case 16 in the horizontal direction so that the corresponding position relative to the wiring sheet 6, i.e., corresponding position between the first contact pad 12 of the lead 10 on the wiring sheet 6 and the contact element 11 on the IC body 4 is correctly set. As in the above description, the IC body 4 is stably moved between the wiring sheet 6 and the support seat 5 while being restricted by the wiring sheet 6 and the support seat 5 and fixed to a predetermined position by the respective male screw pins 21 clamping the corner portions of the IC body 4. The wiring sheet 6 covers or overlies the IC body 4 so as to form the leads on the IC body 4, prevent the IC body 4 from dropping from the carrier body 1 and guide the above-mentioned slight movement.

Figure 14:
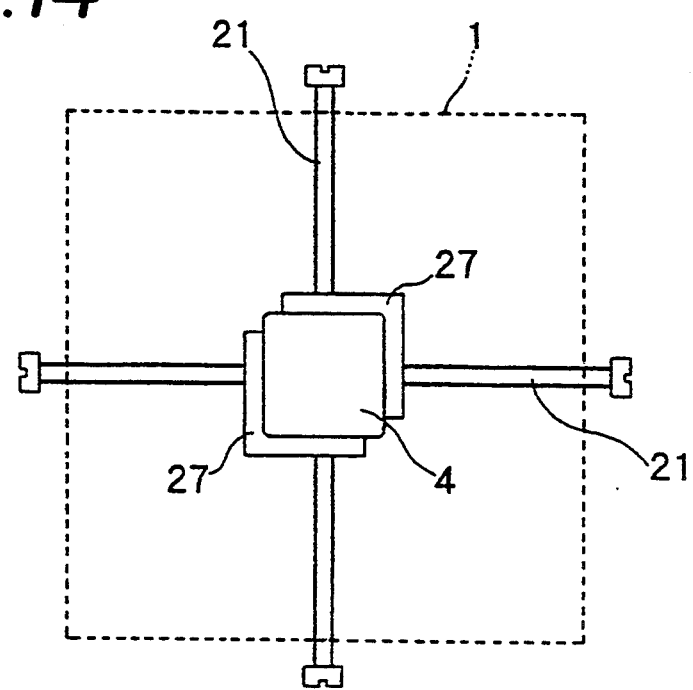
FIG. 14 is a plan view exemplifying a pressing pad which is used together with the fine adjustment pushers.

In the examples shown in FIGS. 14 through 17, the IC body 4 is indirectly pressed through pads 27 instead of being directly pressed by the fine adjustment pushers such as male screw pins 21 or the like. First, FIG. 14 shows such one example. As illustrated, L-shaped pads 27 are engaged with corner portions, for example, a pair of opposite corner portions, of the IC body 4. The end faces of the above-mentioned male screw pins 21 are brought into abutment with the side surfaces of the pads 27. By turning the male screw pins 21, the male screw pins 21 press the pads 27 and the pads 27, in turn, press the IC body 4.

FIG. 15 shows another example, in which the pads 27 are connected to the tip portions of the fine adjustment pins as represented by the male screw pins 21. The pads 27 are connected to the tip portions of the male screw pins 21 such that they can turn on the pins 21 and slightly move forwardly and backwardly. In other words, the pads 27 are connected such that they can universally move relative to the male screw pins 21. When the male screw pins 21 are moved forwardly, the pads 27 can move in response to the movement of the pins 21 while being closely attached to the side surfaces of the IC body 4. The pressing surfaces 28 of the respective pads 27 are planar.

In the example of FIG. 16, the pads 27 are in abutment with the side surfaces of the IC body 4 or the protective case 16, and threadedly engaged with the tip portions of the male screw pins 21. Each of the pads 27 is moved forwardly and backwardly as each of the male screw pins 21 is turned, and presses the IC body 4 or the protective case 16 with the pressing surface 28 closely attached to the IC body 4 or the case 16, in order to slightly move the IC body or the case. It may be arranged such that the male screw pin 21 is threadedly engaged with the carrier body 1 side, and the pressing pad 27 is turnably attached to the pin 21 instead of being threadedly engaged with the pin, so that the pad 27 is formed forwardly and backwardly in response to the reciprocal movement of the pin 21.

Figure 17:
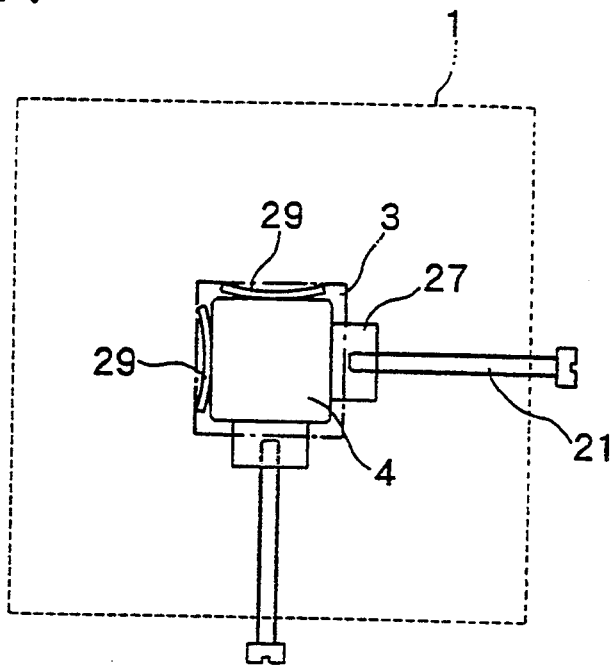
FIG. 17 is a plan view showing one example in which fine adjustment pushers and spring members are used as fine adjustment means for the IC body.

In the example of FIG. 17, spring members 29 for resiliently holding adjacent two side surfaces of the IC body 4 or the protective case 16 are disposed at two side surfaces of the IC receiving portion 3, and the remaining two side surfaces of the IC body 4 are pressed by the above-mentioned male screw pins 21.

More specifically, as illustrated, the male screw pins 21 extend perpendicular direction from adjacent two side surfaces of the IC body 4, and the spring members 29 are disposed at the remaining two side surfaces of the IC body 4.

When each of the male screw pins 21 is moved forwardly to press the IC body 4 or the case 16, the spring member 29 disposed on the side opposite to the pressing side is compressed, while being supported on the inner wall of the IC receiving portion 3, to absorb the amount of movement of the IC body or the case 16, and the IC body 4 or the case 16 is held between the male screw pin 21 and the spring member 29 so as to be fixed to a predetermined position.

As illustrated, a curved plate spring, for example, is used as the spring member 29 and a side surface of the IC body 4 or the case 16 is supported by a projection portion thereof. Opposite ends of the plate spring 29 are supported on the inner wall surface of the IC receiving portion 3. As mentioned previously, the tip of each of the male screw pins 21 may be provided with the pressing pad 27.

Figure 18:
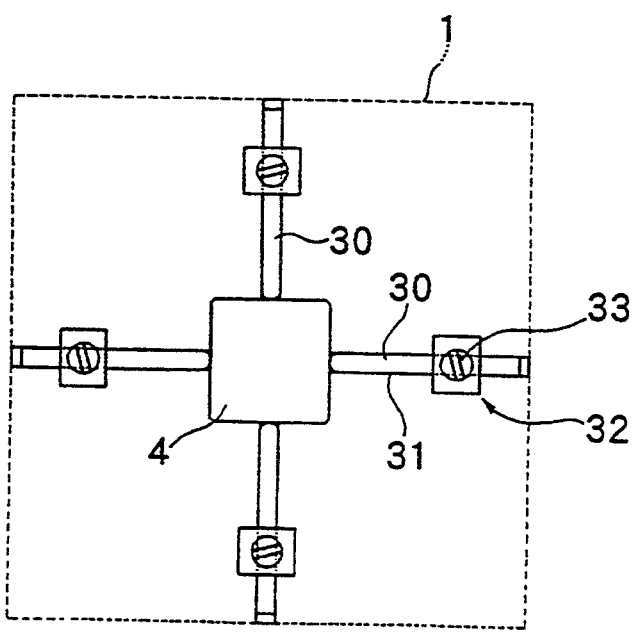
FIG. 18 is a plan view showing another example in which plain pins are used as fine adjustment pushers.

In the example of FIG. 18, plain pins are used instead of the male screw pins 21 and the tips of the plain pins 30 are acted on the sides surfaces of the IC body 4 as in the above-mentioned male screw pins 21. That is, the plain pins 30 are sliding fitted into the carrier body 1 such that they extend perpendicular to the respective side surfaces of the IC body 4, and one ends of the plain pins 30 are disposed opposite to the respective side surfaces of the IC body 4 or the case 16.

For example, the plain pins 30, as in the male screw pins 21 are reciprocally movably pierced from the outer side surfaces of the carrier body 1 to the inner side surfaces of the IC receiving portion 3. Otherwise, grooves 31 are formed in the upper surface of the carrier body 1, and the plain pins 30 are reciprocally movably fitted into these grooves 31. There are provided fixture means 32 for fixing the plain pins 30 to optionally reciprocating positions. By releasing the fixture means 32, the plain pins 30 are permitted to freely move forwardly and backwardly to press the IC body 4 or the case 16, so that the IC body 4 is correctly positioned. After the IC body 4 has been correctly positioned, the plain pins 30 are fixed by the fixture means 32 such that the plain pins 30 cannot move forwardly and backwardly, and the IC body 4 or the case 16 are, in turn, clamped by and between the tips of the plain pins so as to be fixed to a predetermined position.

As the fixture means 32, a screw 33 is reciprocally movably provided relative to the upper surface of each of the plain pins 30 and the tip of the screw 33 is pressed against the upper surface of the plain pin 30 in order to prevent the pin from moving. The above-mentioned arrangement, the pads 27, the spring members, etc. are, of course, applicable to the plain pins 30 in accordance with necessity.

In the example of FIG. 19, eccentric cams 34 are used as the fine adjustment pushers. The eccentric cams 34 are, as in the male spring pins 21 and the plain pins 30, means for slightly adjusting the position of the IC body 4 relative to the wiring sheet 6 by pressing the side surfaces of the IC body 4 or the protective case 16. As one example, as shown in FIG. 19, a plurality of eccentric cams 34 are disposed opposite to the respective sides of the IC body 4 or the case 16. These eccentric cams 34 are pivotally supported on the carrier body 1 through a shaft 35 such that they can pivot in a horizontal direction. Each of the eccentric cams 34 is provided with an operating lever 36. This operating lever 36 is operated to pivot the eccentric cam 34 in the horizontal direction so that the corresponding side surface of the IC body 4 or the case 16 is pressed by its eccentric portion.

In accordance with the pivotal movement of the eccentric cams 34, the IC body 4 or the case 16 are horizontally moved in all directions along the inner upper surface of the wiring sheet 6 while sliding on the upper surface of the support seat 5, thereby adjusting the installing position. By fixing the eccentric cams 34 with the use of the fixture means 37, the IC body 4 or the case 16 is fixedly clamped by and among the eccentric cams 34.

As shown in FIG. 19, as one example of the above-mentioned fixture means 37, the screws 38 are provided on the operating levers 36 of the eccentric cams 34 such that the screws 38 can move within and along arcuate elongated-grooves 39 in accordance with the pivotal movement of the eccentric cams 34, and the screws 38 are tightened to the carrier body 1 at a predetermined pivotal position in order to fix the eccentric cams 34.

In this example, the eccentric cams 34 and the spring members 29 can be used together as in the case with the above-mentioned male screw pins 21. The eccentric cams 34 are arranged in such a manner as to press the side surfaces or corner portions of the IC body 4 or the protective case 16, also as in the case with the male screw pins 21.

According to the present invention, the embodiments so far described may, of course, be used by properly combining all or a part of them.

As described in the foregoing, the pitches of the contact elements on the IC body, which is carried on the carrier body, are enlarged by the lead pattern on the wiring sheet, thereby the leads on the IC body can be correctly connected to the contacts on the socket. Thus, with the use of this carrier assembly, the aging test, etc. can be carried out smoothly and successfully. Moreover, by operating the fine adjustment pushers, the IC body is moved in a horizontal direction between the wiring sheet and the carrier body, so that the position of the IC body can easily and assuredly be adjusted relative to the wiring sheet.

Since the IC body is covered with the wiring sheet, it is favorably protected from external impacts. In addition, when the fine adjustment pushers are pressed to the IC body, the IC body can be adequately moved in a horizontal direction along the inner upper surface of the wiring sheet.

What is claimed is:

1. An IC carrier comprising a carrier body carrying an IC body, which is either alone or received in a protective case, a wiring sheet with a lead pattern applied onto an upper surface thereof and on which said wiring sheet is superimposed in such a manner as to cover an outer upper surface of said IC body, a plurality of fine adjustment pushers for pressing said IC body or said protective case sidewardly at plurality of points in order to slightly move said IC body or said protective case along an inner upper surface of said wiring sheet to adjust the position of said IC body so as to correctly correspond to said wiring sheet, each of said fine adjustment pushers being formed of male screw pins which are threadedly engaged with said carrier body and reciprocally moved, said IC body or said protective case being pressed sidewardly by end faces of said male screws, respectively.

2. An IC carrier as claimed in claim 1, in which a pressing pad of synthetic resin material is disposed at a tip portion of each of said male screw pins, and said IC body or said protective case is pressed through said pressing pads.

3. An IC carrier as claimed 1, in which each of said male screw pins is threadedly engaged with said pressing pad, so that said IC body or said protective case can be slightly moved through said pressing pad.

4. An IC carrier comprising a carrier body carrying an IC body, which is either alone or received in a protective case, a wiring sheet with a lead pattern applied onto an upper surface thereof and on which said wiring sheet is superimposed in such a manner as to cover an outer upper surface of said IC body, a plurality of fine adjustment pushers for pressing said IC body or said protective case sidewardly at plurality of points in order to slightly move said IC body or said protective case along an inner upper surface of said wiring sheet to adjust the position of said IC body so as to correctly correspond to said wiring sheet, each of said fine adjustment pushers being formed of a plain pin which is slidingly fitted into said carrier body and reciprocally moved, said carrier body being provided with fixture means for fixing said plain pin, said IC body or said protective case being pressed sidewardly by an end face of said plain pin.

5. An IC carrier comprising a carrier body carrying an IC body, which is either alone or received in a protective case, a wiring sheet with a lead pattern applied onto an upper surface thereof and on which said wiring sheet is superimposed in such a manner as to cover an outer upper surface of said IC body, a plurality of fine adjustment pushers for pressing said IC body or said protective case sidewardly at plurality of points in order to slightly move said IC body or said protective case along an inner upper surface of said wiring sheet to adjust the position of said IC body so as to correctly correspond to said wiring sheet, each of said fine adjustment pushers being formed of an eccentric cam member.

* * * * *